United States Patent
Kim et al.

(10) Patent No.: US 7,558,122 B2
(45) Date of Patent: Jul. 7, 2009

(54) FLASH MEMORY DEVICE AND METHOD OF ERASING FLASH MEMORY DEVICE

(75) Inventors: Dae-Han Kim, Gangdong-gu (KR); Jung-Woo Lee, Bucheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 24 days.

(21) Appl. No.: 11/938,922

(22) Filed: Nov. 13, 2007

(65) Prior Publication Data
US 2008/0144387 A1    Jun. 19, 2008

(30) Foreign Application Priority Data
Dec. 19, 2006    (KR) .................. 10-2006-0130220

(51) Int. Cl.
*G11C 11/34* (2006.01)
(52) U.S. Cl. .............. 365/185.33; 365/185.23; 365/185.24; 365/185.3
(58) Field of Classification Search ............. 365/185.02
See application file for complete search history.

(56) References Cited

U.S. PATENT DOCUMENTS

| | | | |
|---|---|---|---|
| 5,768,191 A * | 6/1998 | Choi et al. ............. | 365/185.22 |
| 5,856,942 A | 1/1999 | Lee et al. | |
| 6,091,642 A | 7/2000 | Pasotti et al. | |
| 6,438,037 B1 | 8/2002 | Fastow et al. | |
| 6,452,837 B2 | 9/2002 | Mori et al. | |
| 6,493,266 B1 | 12/2002 | Yachreni et al. | |
| 6,529,413 B2 | 3/2003 | Lee et al. | |
| 6,914,827 B2 * | 7/2005 | Choi .................. | 365/185.29 |
| 6,967,873 B2 | 11/2005 | Hamilton et al. | |
| 7,085,167 B2 * | 8/2006 | Lee et al. ............. | 365/185.22 |
| 7,200,049 B2 | 4/2007 | Park et al. | |
| 7,366,020 B2 * | 4/2008 | Choi .................. | 365/185.18 |
| 2006/0109710 A1 | 5/2006 | Hsieh et al. | |
| 2007/0159892 A1 * | 7/2007 | Kang et al. ........... | 365/185.24 |

FOREIGN PATENT DOCUMENTS

| | | |
|---|---|---|
| KR | 100293633 B1 | 10/1999 |
| KR | 100293635 B1 | 10/1999 |
| KR | 1999-0081393 | 11/1999 |
| KR | 1020010061460 A | 7/2001 |
| KR | 1020020036273 A | 5/2002 |

* cited by examiner

*Primary Examiner*—Tan T. Nguyen
(74) *Attorney, Agent, or Firm*—Volentine & Whitt, P.L.L.C.

(57) ABSTRACT

A flash memory device and a method of erasing memory cells in a flash memory device are provided. A first post program operation is performed on erased memory cells having a threshold voltage lower than a first program verify voltage. A second post program operation is performed on erased memory cells having a threshold voltage lower than a second program verify voltage. The second program verify voltage is lower than the first program verify voltage.

24 Claims, 8 Drawing Sheets

FLASH MEMORY DEVICE AND METHOD OF ERASING FLASH MEMORY DEVICE

CROSS-REFERENCE TO RELATED APPLICATIONS

A claim of priority is made to Korean Patent Application No. 10-2006-0130220, filed on Dec. 19, 2006, the subject matter of which is hereby incorporated by reference.

BACKGROUND OF THE INVENTION

1. Field of the Invention

The present invention relates to semiconductor memory device operation, and more particularly, to a flash memory device and a method of erasing a flash memory device.

2. Description of the Related Art

Semiconductor memory devices are typically classified into volatile semiconductor memory devices and non-volatile semiconductor memory devices. The volatile semiconductor memory devices have fast reading and writing speeds, but their stored contents disappear when no external power is applied. In comparison, the non-volatile semiconductor memory devices retain stored contents even when no power is applied. Therefore, the non-volatile semiconductor memory devices are used to store contents, which must remain regardless of power supply. Examples of the non-volatile semiconductor memory devices are a mask read-only memory (MROM), a programmable read-only memory (PROM), an erasable programmable read-only memory (EPROM), and an electrically erasable programmable read-only memory (EEPROM).

Generally, since erase and write operations are relatively difficult in MROMs, PROMs and EPROMs, common users may not be able to update memory contents. To the contrary, since erase and write operations can be electrically performed in EEPROMs, they have become widely used in system programming and auxiliary memory devices, which require continuous updating. A flash EEPROM, in particular, has a higher degree of integration, as compared to a typical EEPROM. The flash EEPROM can therefore be particularly useful in a high-capacity auxiliary memory device. Among the types of flash EEPROMs, a NAND-type flash EEPROM (hereinafter, referred to as a NAND flash memory) has a higher degree of integration, as compared to other types of flash EEPROMs. In contrast, a NOR-type flash EEPROM (hereinafter, referred to as a NOR flash memory) has a relatively low degree of integration, but is capable of performing fast read and write operations.

A cell array of a NOR flash memory device is divided into memory regions (e.g., banks and blocks). Program and erase operations of the NOR flash memory device are performed according to these memory regions. During an erase operation, for example, a flash memory device is generally erased by blocks. In the NOR flash memory device, in particular, an erase voltage of 6 to 10 V is applied to a bulk of the block and a predetermined negative voltage of −10 V is applied to a word line for erasing. A bit line and a common source line of a memory cell maintain a floating state, and electrons implanted on a floating gate are removed by Fowler-Nordheim (F-N) tunneling when satisfying the above bias conditions.

An erase operation is especially important in the NOR flash memory device. Over-erased cells may reduce the reliability of a read operation in adjacent memory cells. Moreover, over-erased cells may cause program failure by interrupting a smooth program operation of adjacent memory cells when a series of program operations are performed after an erase operation. Thus, an over-erased memory cell may cause an error during a read operation and/or interrupt a program operation an adjacent memory cell.

FIG. 1 is a graphical view of threshold voltage distributions of over-erased cells in a typical NOR flash memory device. Referring to FIG. 1, threshold voltages of erased memory cells correspond to the voltage distribution 10. Ideal threshold voltage distributions of erased memory cells exist between a threshold voltage $V_{1b}$ and a threshold voltage $V_2$, i.e., distribution 11. Memory cells having threshold voltage distributions between a threshold voltage $V_{1a}$ and a threshold voltage $V_{1b}$, i.e., distribution 12 (indicated by hatching), are over-erased cells. Memory cells having threshold voltages in a threshold voltage distribution 20 are programmed cells. Although threshold voltage distributions of the programmed memory cells correspond to distribution 20, the programmed memory cells may be included in one of multiple threshold voltage distributions whenever memory cells store multi-bit data.

FIG. 2 is a circuit diagram showing limitations due to over-erased memory cells. Referring to FIG. 2, memory cells MC<0> to MC<4> are connected to the same bit line BL. It is assumed that the memory cells MC<0> to MC<4> are connected to the same common source line CSL, as well. In FIG. 2, the memory cells MC<0>, MC<1>, MC<3> and MC<4> are over-erased memory cells (indicated by hatching). The memory cell MC<2> is programmed with another threshold voltage state which is not an erase state. During a read operation, the memory cell MC<2> is selected such that a read voltage (approximately 4.5 V) is applied to the word line Sel WL of the selected memory cell MC<2>. A voltage of 0 V is applied to the unselected word lines Unsel WLs of the remaining memory cells MC<0>, MC<1>, MC<3> and MC<4>, which are not simultaneously selected.

At this point, a sense amplifier 30 senses a current flowing in the selected memory cell MC<2> in order to detect programmed data. However, when over-erased memory cells are intensively distributed in a specific region, the sense amplifier 30 may detect the selected memory cell MC<2> as an ON cell even though the selected memory cell MC<2> is actually an OFF cell. That is, since the over-erased memory cells MC<0>, MC<1>, MC<3> and MC<4> are OFF cells, the common source line CSL and the bit line BL must be cut off. However, the over-erased memory cells MC<0>, MC<1>, MC<3> and MC<4> cause leakage currents I1<0>, I1<1>, I1<3> and I1<4>, respectively, in a word line voltage of 0 V. The leakage currents I1<0>, I1<1>, I1<3> and I1<4> are provided from the bit line BL to sense the selected memory cell MC<2>. Accordingly, the sense amplifier 30 may sense the selected cell MC<2> as an ON cell due to the leakage currents I1<0>, I1<1>, I1<3> and I1<4>, even though the selected cell MC<2> is an OFF cell. This malfunction more often occurs in a specific cell array where over-erased cells are intensively distributed.

Various attempts to address the above described limitations caused by over-erased memory cells in a flash memory device are disclosed, for example, in U.S. Pat. No. 6,493,266, titled "SOFT PROGRAM AND SOFT PROGRAM VERIFY OF THE CORE CELLS IN FLASH MEMORY ARRAY," U.S. Pat. No. 6,967,873, titled "MEMORY DEVICE AND METHOD USING POSITIVE GATE STRESS TO RECOVER OVER-ERASED CELL," and U.S. Pat. No. 6,452,837, titled "NONVOLATILE SEMICONDUCTOR MEMORY AND THRESHOLD VOLTAGE CONTROL METHOD THEREFOR," the contents of which are hereby incorporated by reference.

However, the above U.S. patents do not address an increase of a threshold voltage occurring during a post program operation. Accordingly, conventional flash memory devices are not capable of preventing an increased threshold voltage, which occurs during a post program operation.

SUMMARY OF THE INVENTION

An aspect of the present invention provides a method of erasing memory cells in a flash memory device. The method includes performing a first post program operation on erased memory cells having a threshold voltage lower than a first program verify voltage, and performing a second post program operation on erased memory cells having a threshold voltage lower than a second program verify voltage. The second program verify voltage is lower than the first program verify voltage.

The first program verify voltage may be a minimum voltage of a threshold voltage distribution in an erase state.

The method may further include performing a post program verify operation, following the first post program operation, for detecting memory cells programmed with a threshold voltage lower than the first program verify voltage. The second post program operation may not performed when the post program verify operation detects no memory cells programmed with a threshold voltage lower than the first program verify voltage.

Another aspect of the present invention provides a method of erasing memory cells in a flash memory device. The method includes performing a post program operation to program erased memory cells having a threshold voltage lower than a first program verify voltage, and detecting erased memory cells having a voltage higher than a maximum voltage of a threshold voltage distribution in an erase state.

The method may further include performing a second post program operation on the erased memory cells having a threshold voltage lower than a second program verify voltage. The second program verify voltage may be lower than the first program verify voltage. Also, the first program verify voltage may be a minimum voltage of the threshold voltage distribution in the erase state.

The flash memory device may be determined to be faulty when the detected memory cells are post-programmed with a threshold voltage higher than the maximum voltage of the threshold voltage distribution in the erase state.

Another aspect of the present invention provides a method of erasing memory cells in a flash memory device. The method includes selecting memory cells on which to perform a post program operation, the selected memory cells having a threshold voltage lower than a first program verify voltage. A program verify operation is performed on the selected memory cells with a second program verify voltage lower than the first program verify voltage. Erased memory cells are detected having a threshold voltage higher than a maximum voltage of a threshold voltage distribution in an erase state.

The method may further include erasing the memory cells before selecting of the memory cells on which to perform the post program operation.

Detecting the erased memory cells may include performing an erase verify operation on the memory cells. The method may further include determining that the flash memory device is faulty, based on a result of the erase verify operation, when there are detected erased memory cells programmed with a threshold voltage higher than the maximum voltage of the threshold voltage distribution in an erase state. Also, the erase operation may be ended, based on a result of the erase verify operation, when there are no detected erased memory cells programmed with a threshold voltage higher than the maximum voltage of the threshold voltage distribution in an erase state.

Detecting the erased memory cells may include performing a read operation on the memory cells. The read operation may include a word line voltage higher than the maximum voltage of the threshold voltage distribution in the erase state.

Yet another aspect of the present invention provides a flash memory device, including a cell array, having multiple memory cells; a sense amplifier, connected to bit lines of the memory cells, for sensing programmed data in each of the memory cells; and a write driver, connected to the bit lines of the memory cells, for providing program data to the cell array. A voltage generator of the flash memory device provides at least one of a program voltage, a first program verify voltage, a second program verify voltage lower than the first program verify voltage, and an erase verify voltage higher than the first program verify voltage, to a word line of selected memory cells. A control logic controls the voltage generator and the write driver to perform a post program operation on erased memory cells having a threshold voltage lower than the first program verify voltage, and to detect erased memory cells having a threshold voltage higher than a maximum voltage of a threshold voltage distribution in an erase state, during an erase operation.

The first program verify voltage may be a word line voltage that indicates whether the memory cells are over-erased. The erased memory cells having a threshold voltage higher than the maximum voltage of the threshold voltage distribution in the erase state may be detected in response to the control logic controlling the voltage generator to provide the erase verify voltage to the word line of the memory cells, after a verify operation provides the second program verify voltage to the word line of the selected memory cells.

The control logic may determine an erase failure when at least one memory cell has a higher threshold voltage than the erase verify voltage. Also, the control logic may determine an erase failure when data read from the memory cells does not correspond to the erase state.

The erase verify voltage may be a read voltage for reading the data in the erase state, such that the read voltage is higher than the maximum voltage of the threshold voltage distribution in the erase state. The erase verify voltage may be lower than a read voltage for reading the data in the erase state. The erase verify voltage may be higher than the maximum voltage of the threshold voltage distribution in the erase state. The memory cells may be NOR flash memory cells.

BRIEF DESCRIPTION OF THE DRAWINGS

The accompanying figures are included to illustrate exemplary embodiments of the present invention, and are incorporated in and constitute a part of this specification. The embodiments of the present invention will be described with reference to the attached drawings, in which.

DETAILED DESCRIPTION OF THE EMBODIMENTS

Figure 1:
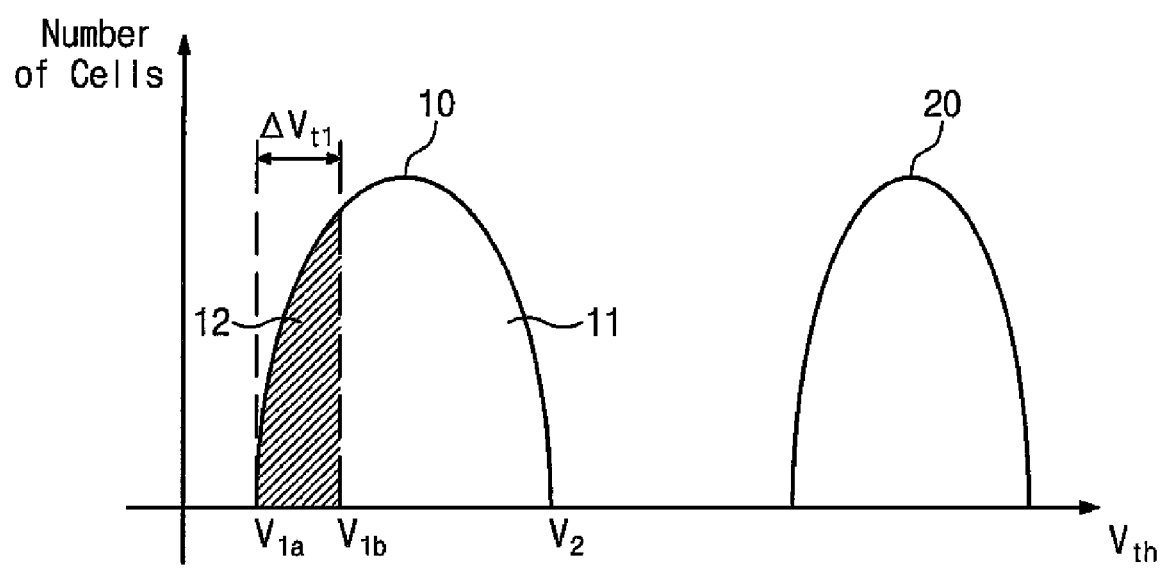
FIG. 1 is a graphical view of threshold voltage distributions of over-erased cells.
Figure 2:
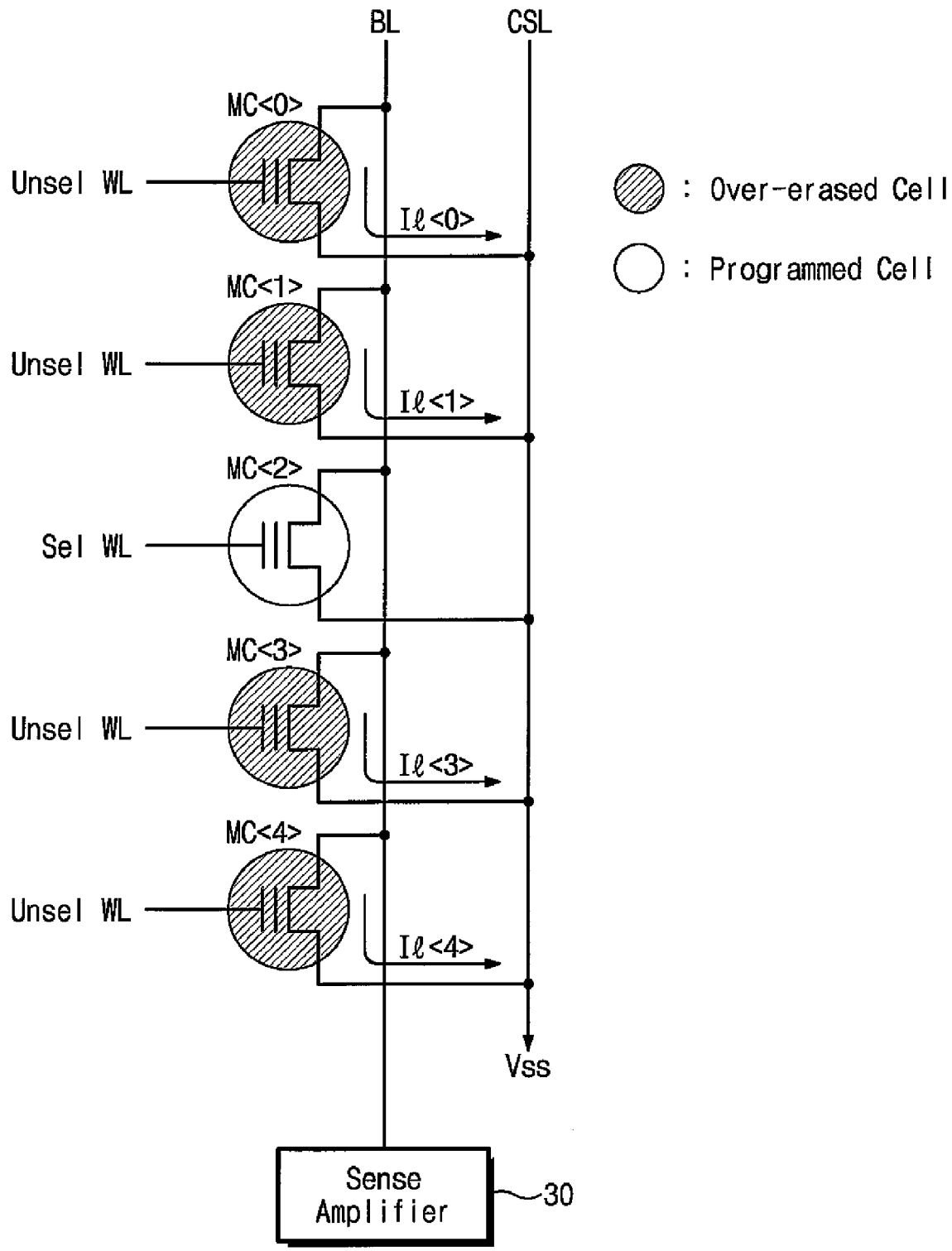
FIG. 2 is a circuit diagram showing to over-erased cells.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Various features and functions of the present invention are described through various illustrative embodiments, which use a flash memory device as an example. The various embodiments include methods of erasing the flash memory device, which prevent over programming phenomena during post program operations. Furthermore, post program operations repair over-erased memory cells after an erase operation.

Figure 3:
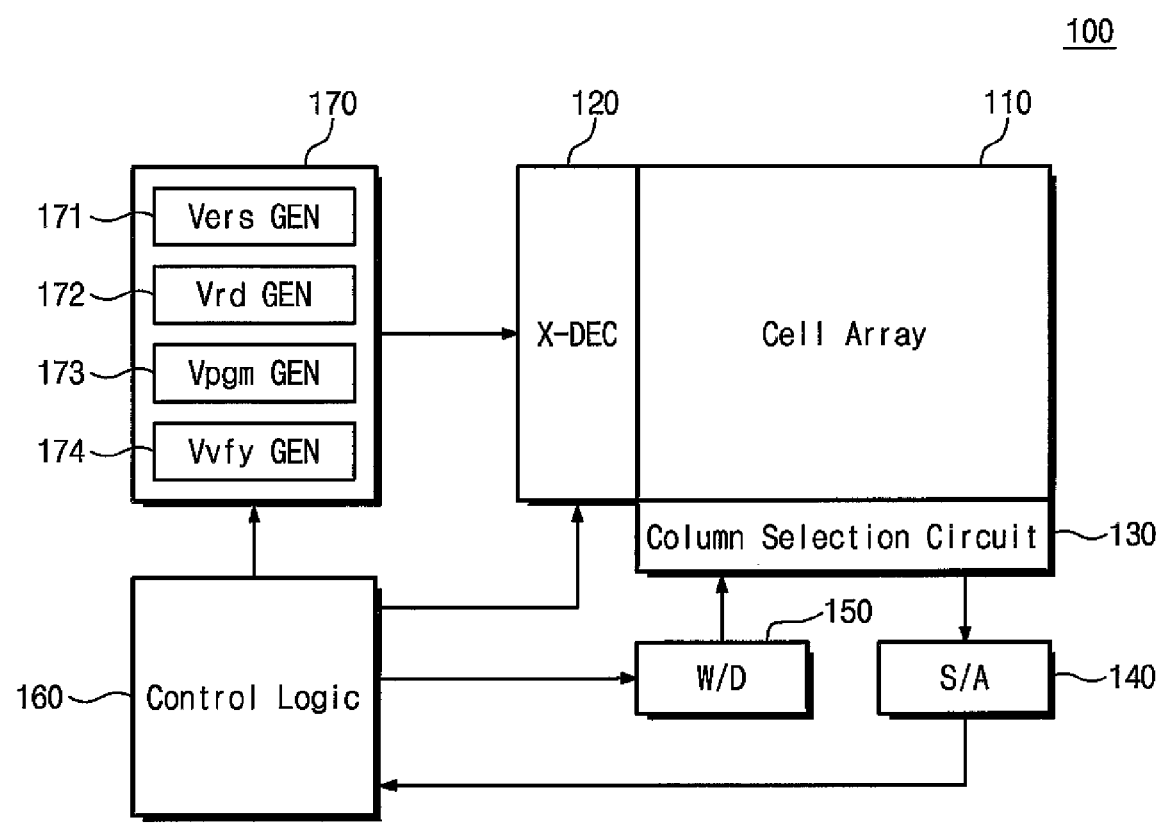
FIG. 3 is a block diagram showing a flash memory device for performing an erase operation, according to an exemplary embodiment of the present invention.

FIG. 3 is a block diagram of a flash memory device 100 performing an erase operation, according to an exemplary embodiment of the present invention. Referring to FIG. 3, a flash memory device 100 performs a post program operation after performing an erase operation. During the post program operation, the flash memory device 100 selects and programs over-erased memory cells. After the post program operation, the flash memory device 100 performs an additional verify operation that determines whether there are cells having threshold voltages that increase due to the post program operation.

A cell array 110 includes memory cells MCs (not shown) formed on intersecting regions of word lines WLs and bit lines BLs. According to a voltage applied to a selected word line WL, the memory cells MCs are turned ON or OFF. The ON or OFF state of a memory cell MC determines a current flow of the selected bit line BL. Program data of the memory cell MC is sensed and output by sensing a bit line current.

A row decoder 120 selects a block of the cell array 110 in response to a row address, and selects a word line of the selected block. The row decoder 120 is configured to deliver word line voltages Vers, Vrd, Vpgm and Vvfy, respectively supplied by generators 171, 172, 173, and 174 of the voltage generator 170, to the selected word line through the row decoder 120. A column selection circuit 130 selects a bit line BL corresponding to a selected column in response to a column address. The flash memory device 100 thus selects the memory cells MCs arranged in rows and columns using the row decoder 120 and the column selection circuit 130.

A sense amplifier 140 is electrically connected to the selected bit line BL of the cell array 110. During an erase verify operation, the sense amplifier 140 senses the bit line BL selected by the column selection circuit 130 and delivers the sensed result to the control logic 160. During a read operation, a read voltage is applied to the word line of each cell, and the sense amplifier 140 reads data by sensing a detected bit line current.

A write driver 150 sets up a bit line voltage in order to write the program data into the cell array 110. The write driver 150 provides the bit line voltage to the cells selected during an erase operation in order to perform a post program operation.

The control logic 160 performs a verify operation to minimize a voltage stress, which is applied to the memory cells that are not over-erased during the post program operation. The control logic 160 performs the post program operation on the over-erased cells, and also controls the voltage generator 170 to provide a verify voltage, which minimizes threshold voltage expansion of the normally erased memory cells.

During the post program operation, the control logic 160 controls the voltage generator 170 to provide a verify voltage $V_{1c}$ (FIG. 4B) between a voltage $V_{1a}$ and a voltage $V_{1b}$, which correspond to an over-erased region. When all the over-erased memory cells having a threshold voltage distributed below the verify voltage $V_{1c}$ are programmed, the control logic 160 performs an additional verify operation confirming whether there is a threshold voltage increase of memory cells, which are normally erased according to the post program operation. In alternative embodiments, the additional verify operation may be performed by a verify read operation or a normal read operation. According to the additional verify operation, an error of the next read operation can be prevented by sensing the upward expansion or increase of a threshold voltage according to a post program operation.

The voltage generator 170 generates a word line voltage that is supplied to the selected word line during an additional verify operation, which is performed after the post program operation. Under the control of the control logic 160, the voltage generator 170 generates a post program verify voltage $V_{1c}$, corresponding to the over-erased region during the post program operation, and provides the post program verify voltage $V_{1c}$ to a selected word line. When the additional verify operation is performed according to a verify read operation, the voltage generator 170 generates a voltage $V_2$ and provides it to the selected word line. When the additional verify operation is performed according to a normal read operation, the voltage generator 170 generates a read voltage Vrd between a typical read voltage $V_3$ and the voltage $V_2$, and supplies it to the selected word line.

As described above, post program and additional verify operations are performed such that an increase of a threshold voltage due to the post program operation can be prevented.

Figure 4A:
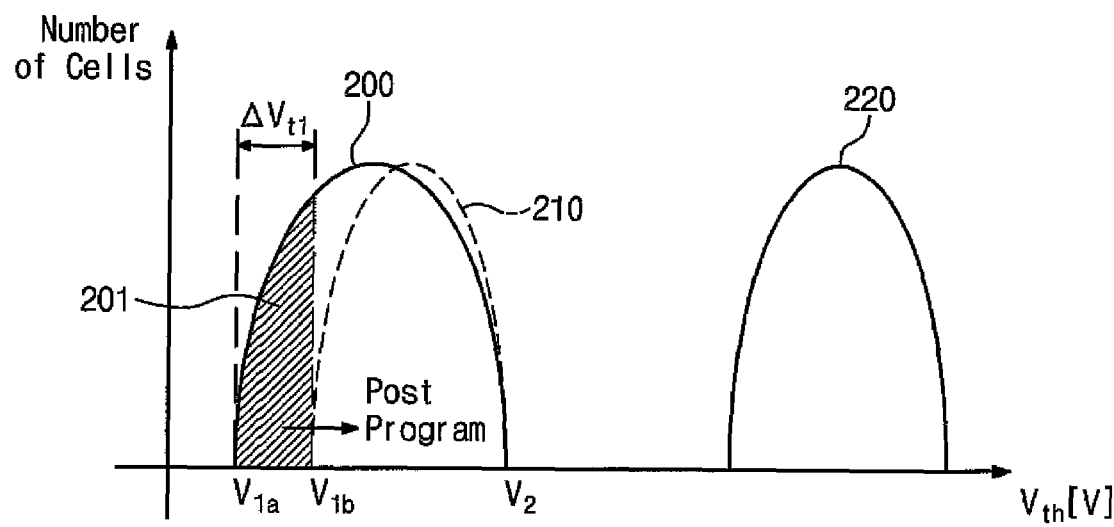
FIG. 4A is a graphical view of a post program operation, according to an exemplary embodiment of the present invention.
Figure 4B:
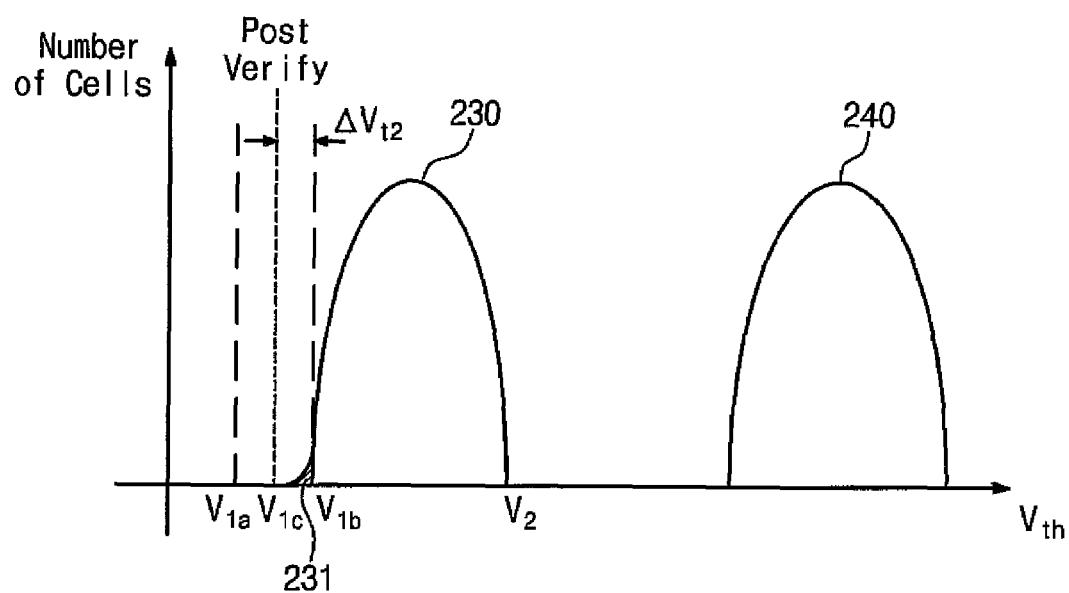
FIG. 4B is a graphical view of a verify operation for a post program operation, according to an exemplary embodiment of the present invention.

FIGS. 4A and 4B are graphical views showing a post program operation of a flash memory device, according to an exemplary embodiment of the present invention. The post program operation marginally increases threshold voltages of the over-erased memory cells. The post program operation does not raise the threshold voltage of all the memory cells more than a reference voltage $V_{1b}$. Although a portion of the memory cells still have a threshold voltage below the reference voltage $V_{1b}$ as a result of the post program operation, no additional post program operation is performed. This minimizes a voltage stress incurred by the normally erased memory cells during the post program operation. Thus, the probability that over-erased cells are intensively distributed in a specific region is decreased, yielding the desirable result.

Referring to FIG. 4A, a threshold voltage distribution 200 is an example of a threshold voltage state of memory cells, which is formed according to an erase operation. The threshold voltage distribution 200 includes memory cells having lower threshold voltages than the reference voltage $V_{1b}$, represented by the threshold voltage distribution 201 (indicated by hatching). These memory cells are over-erased memory cells. The threshold voltage distribution 201 of the over-erased memory cells needs to move to a threshold voltage distribution 210 through the post program operation. Although the threshold voltage distribution 201 of the over-erased memory cells is greater than 0 V in the FIG. 4A, the present invention is not limited to this range. That is, embodiments of the present invention may be directed to over-erased memory cells having a threshold voltage below 0 V, without departing from the spirit and scope of the present invention. A threshold voltage distribution 220 is an example of a threshold voltage range of the programmed memory cells.

Exemplary conditions of a post program operation are shown in FIG. 4B. In particular, a post program verify voltage $V_{1c}$ for the post program operation is distributed between the reference voltage $V_{1a}$ and the reference voltage $V_{1b}$. The threshold voltage distribution 230 represents the distribution of memory cells formed by the post program operation. A threshold voltage distribution 231 (indicated by hatching) represents over-erased cells that have not been repaired after the post program operation. A program verify operation, performed after the post program operation, is performed using the voltage $V_{1c}$, which is lower than the reference voltage $V_{1b}$. Accordingly, even though there are extra memory cells having a threshold voltage distributed between the voltage $V_{1c}$ and the reference voltage $V_{1b}$, the post program operation is finished. The memory cells that are not programmed over the reference voltage $V_{1b}$ after the post program operation may be regarded as memory cells with poor cell properties. Accordingly, a relatively high number of program pulses (e.g., ISPP) needs to be provided to the word line in order to program the threshold voltage over the reference voltage $V_{1b}$.

When all the memory cells are programmed, unselected memory cells incur voltage stress due to the program voltage. However, the post program operation is successful, even though a small portion of the threshold voltage distribution extends below the reference voltage $V_{1b}$, but is greater than the post verify voltage $V_{1c}$. Because of the verify voltage $V_{1c}$ set during the post program operation, the increase of a threshold voltage of the normally erased memory cells, which are not targets of the post program operation, is minimized.

According to the post program operation described with reference to the drawings, threshold voltage of over-erased memory cells are generally improved, overall. Although not all of the over-erased memory cells may be completely corrected, the program operation is finished. According to a verify operation of the present invention for the post program operation, voltage stress on the memory cells is minimized. Accordingly, a method of performing the post program operation minimizes a threshold voltage increase in erased memory cells, such that a sufficient read margin can be achieved.

Figure 5:
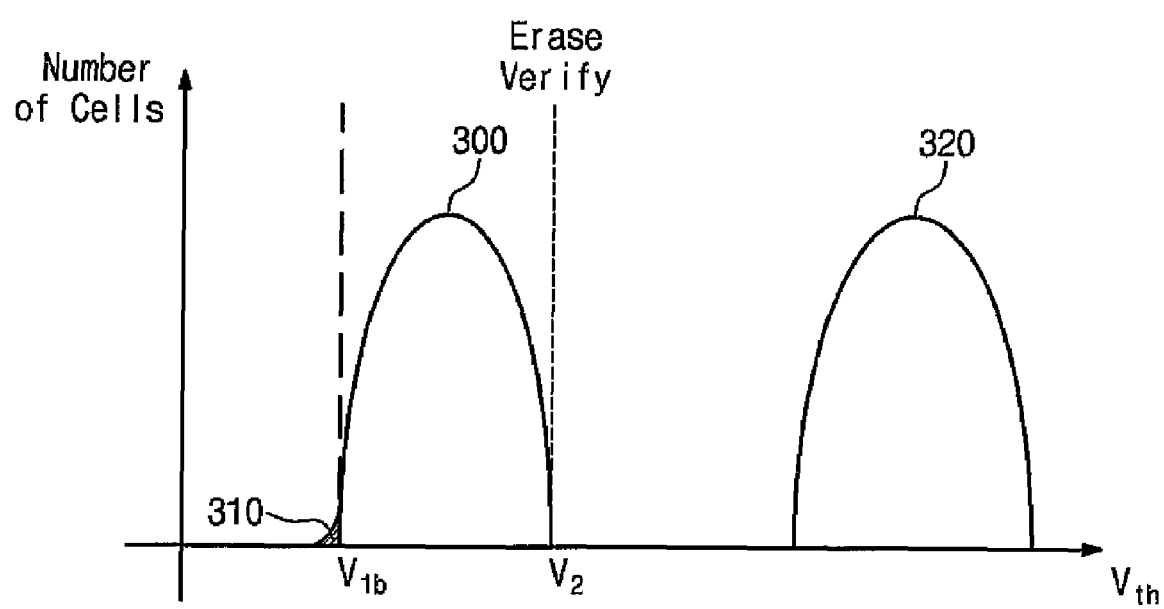
FIG. 5 is a graphical view of an erase verify voltage, according to an exemplary embodiment of the present invention.

FIG. 5 is a graphical view showing an erase verify voltage according to an exemplary embodiment of the present invention. Referring to FIG. 5, a flash memory device performs an erase verify operation after a post program operation, described above. More particularly, during the erase verify operation, a reference voltage $V_2$ is applied as a verify voltage to a word line of memory cells. When erased memory cells have a threshold voltage state higher than the reference voltage $V_2$, the erase operation is determined to have failed. However, when all erased memory cells have a threshold voltage state below the threshold voltage $V_2$, as shown in FIG. 5, the erase operation is determined to have succeeded. The erase verify operation may be performed by the control logic 160 of FIG. 3, for example.

Figure 6:
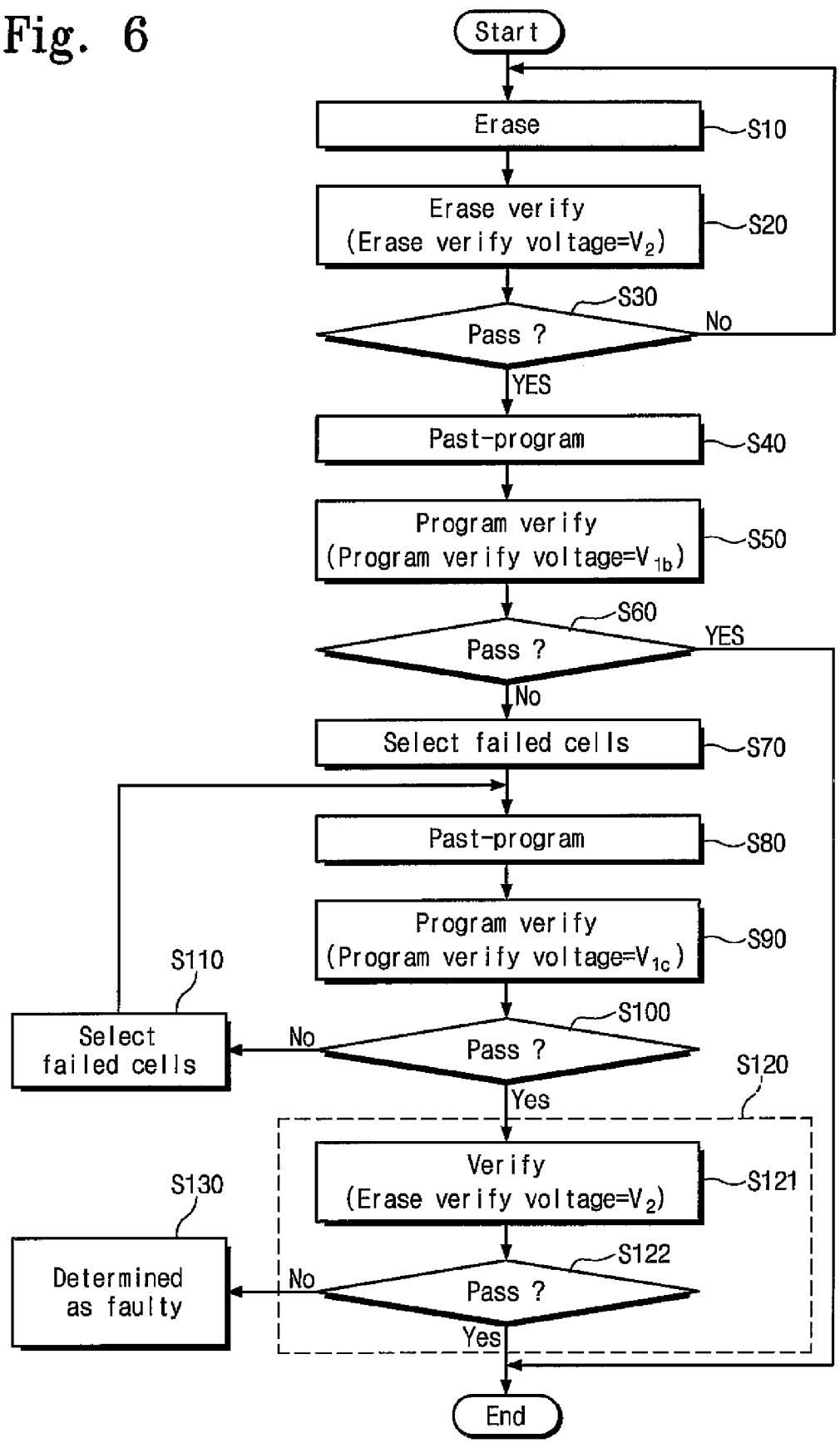
FIG. 6 is a flowchart showing an erasing process, according to an exemplary embodiment of the present invention.

FIG. 6 is a flowchart according to an exemplary embodiment of the present invention, in which the flash memory device performs an erase verification operation. Referring to FIG. 6, an erase operation of the present embodiment begins when a block is selected to be erased in response to an erase command. A typical erase operation applies a negative voltage of –10 V to a word line of the selected memory cell and applies a voltage of 6 to 8 V to a bulk region, for example, in operation S10.

The erased memory cells are erase verified when an erase verify voltage $V_2$ is supplied to the word line in operation S20. The erase verify voltage $V_2$ is the same as an erase verify voltage supplied after a post program operation, discussed below. As a result of the erase verify operation, when it is determined that threshold voltages of the selected memory cells are less than the erase verify voltage $V_2$, the erase operation passes (S30—Yes), and the process advances to a first post program operation S40. However, when there are memory cells having a higher threshold voltage than the erase verify voltage $V_2$, the erase operation does not pass (S30—No) and the erase operation is repeated, returning to operation S10.

After successful completion of the erase operation, a first post program operation S40 is performed to improve a threshold voltage of over-erased memory cells. For the first post program operation S40, memory cells having a threshold voltage below a reference voltage $V_{1b}$ are selected. A program voltage is applied to the word line to program the over-erased memory cells to exceed the reference voltage $V_{1b}$ in operation S40. After applying the program voltage for the first post program operation, the over-erased memory cells are program-verified in operation S50 to determine whether they pass or fail. The program verify operation S50 is performed using a verify voltage $V_{1b}$.

When it is determined in operation S60 that the threshold voltages of all the memory cells are programmed over the reference voltage V1b following the post program operation, the memory cells pass and the first post program operation is successful (S60—Yes), so the erase operation is finished. However, when it is determined in operation S60 that not all of the memory cells have a threshold voltage over the reference voltage V1b, the post program operation does not pass (S60—No), and the verify operation of the present embodiment proceeds.

In operation S70, the failing memory cells (i.e., the memory cells having a threshold voltage less than $V_{1b}$) are selected for reprogramming. In a second post-program operation S80, a program voltage for reprogramming is applied to a word line of each memory cell determined to have failed. The reprogrammed memory cells are verified using the verify voltage $V_{1c}$ in operation S90. According to the verified result, the memory cells having a threshold voltage lower than the verify voltage $V_{1c}$ are determined to have failed (S100—No). These failed memory cells are selected again in operation S110, and the post-program operation S80 is repeated.

However, the memory cells successfully reprogrammed over the verify voltage $V_{1c}$ pass (S100—Yes), and are erase-verified according to the erasing method of the present embodiment in operation S120. More particularly, the erase verify operation is performed using an erase verify voltage $V_2$.

The erase verify operation determines when a threshold voltage has increased above the erase verify voltage $V_2$ due to the post program operation. Although second the post program operation, in particular, improves the lower end of lower threshold voltages in over-erased memory cells, the second post program operation also causes voltage stress to the memory cells that were not selected for the second program operation. Accordingly, the threshold voltage distribution in an erase state may shift too far upward, which may affect a threshold voltage of the normally erased memory cells.

Thus, the erase verify operation S121 determines whether threshold voltages the memory cells have been excessively increased or shifted upward. The increased threshold voltage reduces a read margin of the memory cells, thereby drastically decreasing reliability of a read operation. When any of the memory cells unselected during the second post program operation have a threshold voltage exceeding the erase verify voltage $V_2$, the memory device is determined to have failed (S122—No), and the memory device is deemed faulty in operation 130. However, when there is no memory cell having a threshold voltage exceeding the erase verify voltage $V_2$, the memory device is determined to have passed (S122—Yes), and the general erase operation is successfully completed.

According to the above erase operation, which is performed in stages, a post program operation minimizes stress on selected memory cells. Moreover, the erase operation includes an erase verify operation to verify whether an upper threshold voltage increases due to the post program operation. According to these operations, expansion of a lower threshold voltage can be minimized. Additionally, since the erase operation can verify whether there are memory cells having a threshold voltage exceeding an upper threshold voltage, reliability of the read operation is increased.

Figure 7:
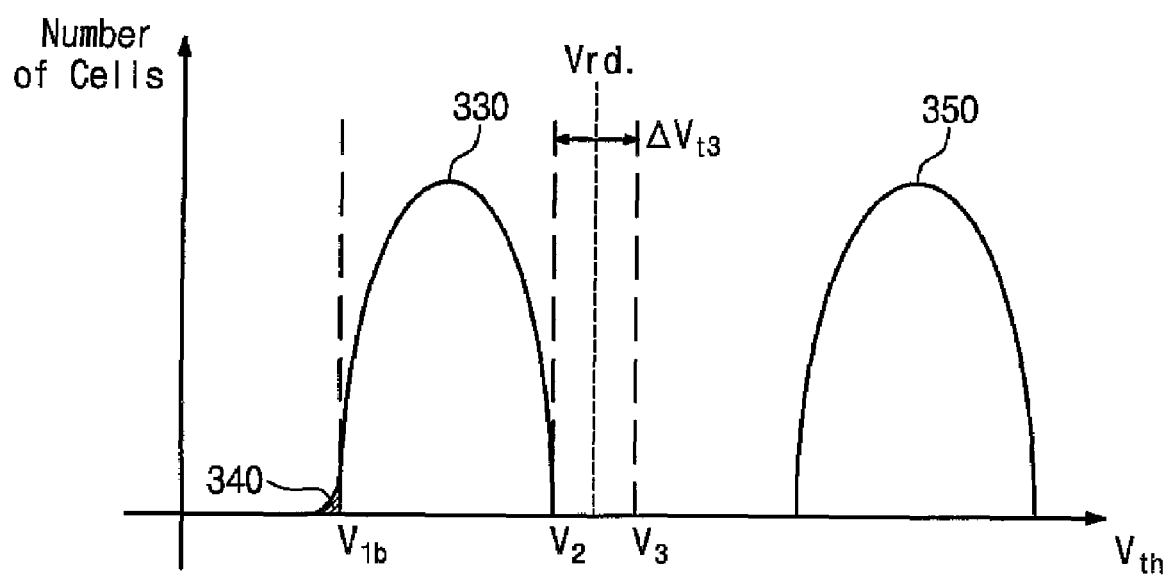
FIG. 7 is a graphical view of a read voltage, according to an exemplary embodiment of the present invention.

FIG. 7 is a graphical view showing a read voltage according to another exemplary embodiment of the present invention. Referring to FIG. 7, an erase verify operation may be accomplished through a normal read operation using a read voltage (e.g., 3 V). Generally, a read operation is performed relatively quickly, compared to a verify operation. The read operation is performed with a read voltage higher than a reference voltage $V_2$ of an erase verify operation, providing a predetermined margin for the erase verify operation.

Figure 8:
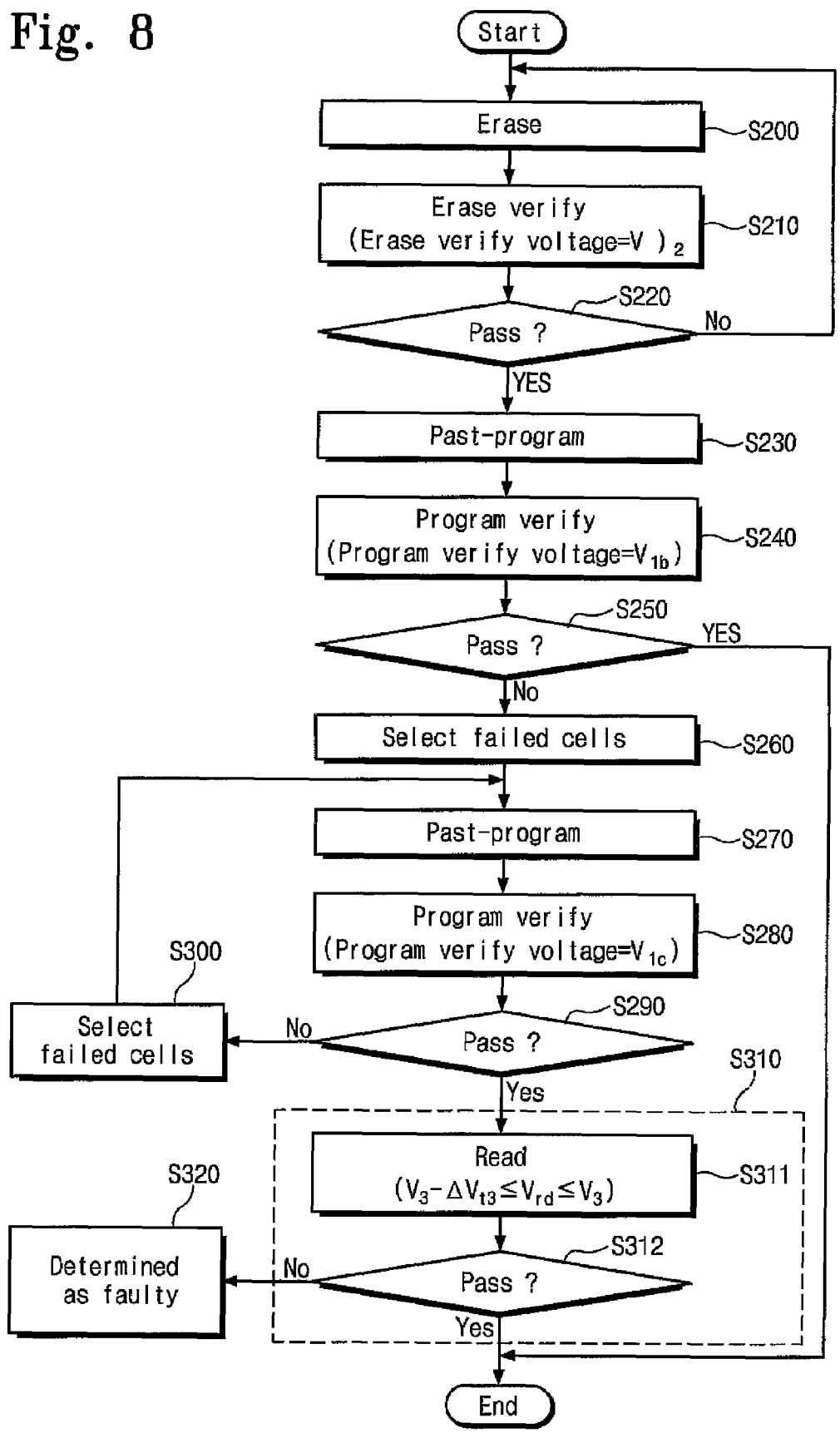
FIG. 8 is a flowchart showing an erasing process, according to an exemplary embodiment of the present invention.

FIG. 8 is a flowchart according to an exemplary embodiment of the present invention, in which the flash memory device performs an erase verify operation based on a normal read operation. Referring to FIG. 8, an erase operation begins when a block is selected to be erased in response to an erase command. A typical NOR flash memory device is erased by applying a negative voltage of −10 V to a word line of the selected memory cells, and a voltage of 6 to 8 V to a bulk region, for example, in operation S200.

The memory cells to which an erase voltage is applied according to the above bias condition are erase verified in operation S210 using an erase verify voltage $V_2$. The erase verify operation S210 detects whether or not a threshold voltage of the erased memory cells is shifted to a normal erase level. As a result of the erase verify operation S210, when it is determined that threshold voltages of the selected memory cells are less than the erase verify voltage $V_2$, the erase operation passes (S220—Yes), and the process advances to a post program operation S230. However, when it is determined in operation S220 that there are memory cells having a threshold voltage higher than the erase verify voltage $V_2$, the erase operation does not pass (S220—No), and the erase operation is repeated, returning to operation S200.

Once the erase operation is completed (S220—Yes), a first post program operation S230 is performed to improve a threshold voltage of over-erased memory cells. For the first post program operation S230, memory cells having a threshold voltage below a reference voltage $V_{1b}$ are selected. A program voltage is applied to a word line of the over-erased memory cells, which are programmed to exceed the reference voltage $V_{1b}$. It is apparent that the program voltage in operation S230 may be a typical program voltage, or may be soft-programmed with a voltage lower than a typical program voltage.

After applying the program voltage for the first post program operation S230, the over-erased memory cells are verified using the verify voltage $V_{1b}$ in a program verify operation S240. When it is determined in operation S240 that the threshold voltages of all the memory cells are programmed over the reference voltage $V_{1b}$ following the first post program operation S230, the memory cells pass and the first post program operation is successful (S250—Yes), so the erase operation is finished. However, when it is determined in operation S250 that not all of the memory cells have a threshold voltage over the reference voltage V1b, the post program operation does not pass (S250—No), and the verify operation of the present embodiment proceeds. In particular, the failed memory cells are selected at operation S260 for reprogramming, and a second post program operation S270 is then performed on the selected memory cells based on a verify voltage $V_{1c}$.

In the second post program operation S270, a program voltage is applied to the word line of the failed memory cells for reprogramming. The reprogrammed memory cells are verified using the verify voltage $V_{1c}$ in operation S280. According to the verified result, the memory cells having a lower threshold voltage than the verify voltage $V_{1c}$ are determined to have failed (S290—No). These failed memory cells are selected again in operation S300 for reprogramming in operation S270.

However, the memory cells programmed with voltages that exceed the verify voltage $V_{1c}$ pass (S290—Yes) and are detected by a read operation of the present embodiment in operation S310. Notably, performing a verify operation using an erase verify voltage, as discussed above, is limited in verification speed due to the addition of the pass/fail logic. However, the read operation can omit these operations, increasing verification speed.

The magnitude of the word line voltage for the read operation is illustrated in FIG. 7. The read voltage Vrd for an erase verify operation S311 is selected in relation to a read voltage $V_3$ used to read data in an erase state. The read voltage Vrd used for as a verifying voltage is between the read voltage $V_3$ and the verify voltage $V_2$ for the erase verify operation. This provides a margin for the read operation.

When there are memory cells programmed with voltages exceeding the read voltage Vrd, the memory cells are determined to have failed (S312—No), and the memory device is determined to be faulty in operation S320. When there are no memory cells programmed over the read voltage Vrd, the memory device is determined as erase pass (S312—Yes), and the general erase operation is ended. Notably, when there are memory cells having a threshold voltage higher than the read voltage Vrd, the read data includes data of an ON memory cell. However, when the memory cells selected for erasing include read data indicating an OFF cell during a read operation through a read voltage Vrd, this may be determined as an erase pass.

According to the above erase operation, which is performed in stages, a post program operation minimizes stress on selected memory cells. Moreover, the erase operation includes a read operation to verify whether there an upper threshold voltage increases due to the post program. According to these operations, the expansion of a lower threshold voltage can be minimized. Additionally, since the erase operation can verify whether there are memory cells having a threshold voltage exceeding an upper threshold voltage, reliability of the read operation and the next program operation can be achieved.

Thus, according to embodiments of the present invention, a flash memory device having an erase operation cuts off or detects a threshold voltage increase after a post program operation, such that reliable operations can be achieved.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of erasing a plurality of memory cells in a flash memory device, the method comprising:
    performing a first post program operation on erased memory cells having a threshold voltage lower than a first program verify voltage; and
    performing a second post program operation after performing the first post program operation, on erased memory cells having a threshold voltage lower than a second program verify voltage,
    wherein the second program verify voltage is lower than the first program verify voltage.

2. The method of claim 1, wherein the first program verify voltage is a minimum voltage of a threshold voltage distribution in an erase state.

3. The method of claim 1, further comprising:
    performing a post program verify operation, following the first post program operation, for detecting memory cells programmed with a threshold voltage lower than the first program verify voltage.

4. The method of claim 3, wherein the second post program operation is not performed when the post program verify operation detects no memory cells programmed with a threshold voltage lower than the first program verify voltage.

5. A method of erasing a plurality of memory cells in a flash memory device, the method comprising:
    performing a post program operation to program erased memory cells having a threshold voltage lower than a first program verify voltage; and
    after performing the post program operation, detecting erased memory cells having a voltage higher than a maximum voltage of a threshold voltage distribution in an erase state.

6. The method of claim 5, further comprising:
    performing a second post program operation on the erased memory cells having a threshold voltage lower than a second program verify voltage,
    wherein the second program verify voltage is lower than the first program verify voltage.

7. The method of claim 6, wherein the first program verify voltage is a minimum voltage of the threshold voltage distribution in the erase state.

8. The method of claim 5, wherein the flash memory device is determined to be faulty when the detected memory cells are post-programmed with a threshold voltage higher than the maximum voltage of the threshold voltage distribution in the erase state.

9. A method of erasing a plurality of memory cells in a flash memory device, the method comprising:
    selecting memory cells on which to perform a post program operation, the selected memory cells having a threshold voltage lower than a first program verify voltage;
    after performing the post program operation, performing a program verify operation on the selected memory cells with a second program verify voltage lower than the first program verify voltage; and
    after performing the program verify operation, detecting erased memory cells having a threshold voltage higher than a maximum voltage of a threshold voltage distribution in an erase state.

10. The method of claim 9, further comprising:
    erasing the memory cells before selecting of the memory cells on which to perform the post program operation.

11. The method of claim 9, wherein detecting the erased memory cells comprises:
    performing an erase verify operation on the memory cells.

12. The method of claim 11, further comprising:
    determining that the flash memory device is faulty, based on a result of the erase verify operation, when there are detected erased memory cells programmed with a threshold voltage higher than the maximum voltage of the threshold voltage distribution in an erase state.

13. The method of claim 11, further comprising:
    ending the erase operation, based on a result of the erase verify operation, when there is no detected erased memory cells programmed with a threshold voltage higher than the maximum voltage of the threshold voltage distribution in an erase state.

14. The method of claim 9, wherein detecting the erased memory cells comprises:
    performing a read operation on the memory cells.

15. The method of claim 14, wherein the read operation comprises a word line voltage higher than the maximum voltage of the threshold voltage distribution in the erase state.

16. A flash memory device comprising:
    a cell array comprising a plurality of memory cells;
    a sense amplifier, connected to bit lines of the memory cells, for sensing programmed data in each of the memory cells;
    a write driver, connected to the bit lines of the memory cells, for providing program data to the cell array;
    a voltage generator for providing at least one of a program voltage, a first program verify voltage, a second program verify voltage lower than the first program verify voltage, and an erase verify voltage higher than the first program verify voltage, to a word line of selected memory cells; and
    a control logic for controlling the voltage generator and the write driver to perform a post program operation on erased memory cells having a threshold voltage lower than the first program verify voltage, and to detect erased memory cells having a threshold voltage higher than a maximum voltage of a threshold voltage distribution in an erase state, during an erase operation.

17. The flash memory device of claim 16, wherein the first program verify voltage is a word line voltage that indicates whether the memory cells are over-erased.

18. The flash memory device of claim 16, wherein the erased memory cells having a threshold voltage higher than the maximum voltage of the threshold voltage distribution in the erase state are detected in response to the control logic controlling the voltage generator to provide the erase verify voltage to the word line of the memory cells, after a verify operation provides the second program verify voltage to the word line of the selected memory cells.

19. The flash memory device of claim 18, wherein the control logic determines an erase failure when at least one memory cell has a higher threshold voltage than the erase verify voltage.

20. The flash memory device of claim 18, wherein the control logic determines an erase failure when data read from the memory cells does not correspond to the erase state.

21. The flash memory device of claim 20, wherein the erase verify voltage is a read voltage for reading the data in the erase state, the read voltage being higher than the maximum voltage of the threshold voltage distribution in the erase state.

22. The flash memory device of claim 20, wherein the erase verify voltage is lower than a read voltage for reading the data in the erase state.

23. The flash memory device of claim 22, wherein the erase verify voltage is higher than the maximum voltage of the threshold voltage distribution in the erase state.

24. The flash memory device of claim 16, wherein the memory cells comprise NOR flash memory cells.

* * * * *